(12) United States Patent
Feng et al.

(10) Patent No.: US 8,638,124 B1
(45) Date of Patent: Jan. 28, 2014

(54) CLOCK PHASE SHIFT DETECTOR

(71) Applicant: International Business Machines Corporation, Armonk, NY (US)

(72) Inventors: Kai D. Feng, Hopewell Junction, NY (US); Jon-ru Guo, Wappingers Falls, NY (US); Trushil N. Shah, Wappingers Falls, NY (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/707,748

(22) Filed: Dec. 7, 2012

(51) Int. Cl.
*G01R 25/00* (2006.01)
*H03K 5/13* (2006.01)
(52) U.S. Cl.
USPC ............... 327/3; 327/236; 327/254; 327/255
(58) Field of Classification Search
USPC ............ 327/2, 3, 5, 7–10, 12, 147, 148, 156, 327/157, 231, 233–236, 238, 244, 254, 255
See application file for complete search history.

(56) References Cited

U.S. PATENT DOCUMENTS

| | | | |
|---|---|---|---|
| 4,639,719 A | 1/1987 | Pappano et al. | |
| 6,550,237 B1 | 4/2003 | Adamczyk et al. | |
| 6,958,637 B2 * | 10/2005 | Feng | 327/157 |
| 7,262,725 B2 | 8/2007 | Huang et al. | |
| 7,271,622 B2 | 9/2007 | Metaxakis | |
| 7,498,889 B2 * | 3/2009 | Altmann | 331/17 |
| 7,885,368 B2 | 2/2011 | Altmann | |

* cited by examiner

*Primary Examiner* — Patrick O'Neill
(74) *Attorney, Agent, or Firm* — Yuanmin Cai; Keivan Razavi

(57) ABSTRACT

A clock phase shift detector circuit may include a phase detector for generating a phase signal based on a phase difference between first and second clock signals. A current mirror having a first, a second, and a third integrator may be coupled to the phase detector, whereby the first integrator integrates the first clock signal and generates a first voltage, the second integrator integrates the first clock signal and generates a second voltage, and the third integrator integrates the phase signal and generates a third voltage. A first comparator receives the first and the third voltage, and generates a first control signal. A second comparator receives the second and the third voltage, and generates a second control signal. The first and second control signals may detect a change between the phase difference of the first and the second clock signal and an optimized phase difference.

20 Claims, 4 Drawing Sheets

CLOCK PHASE SHIFT DETECTOR

BACKGROUND a. Field of the Invention

The present invention generally relates to clock signals, and more particularly to maintaining the integrity of phase relationships between clock signals.

b. Background of Invention

Clock signals may be used in, among other things, digital communications and digital systems in general. As the integrity of the clock signals deteriorate, so may the overall operation and/or performance of the system. Quadrature clocks may be used in many digital system applications such as high-speed digital transmitters and receivers. Quadrature clocks may typically include two clock signals having a phase separation or difference of 90° ($\pi/2$).

Clock skew problems may cause a departure in the 90° ($\pi/2$) phase relationship of quadrature clock signals, which in turn may impact the system performance of the device or system using these clock signals. For example, in high-speed communication applications where quadrature clock signals provide the requisite timing for signal transmission and reception, phase variations in quadrature clock signals may ultimately cause an increase in bit-error rate (BER).

Variations in process, voltage, and temperature (PVT) may contribute to causing clock skew within, for example, semiconductor devices that include quadrature clocks. In addition, unmatched clock paths within circuits may also contribute to increased clock skew problems. It may, therefore, be advantageous, among other things, to maintain requisite phase relationships between signals such as for example, quadrature clock signals.

BRIEF SUMMARY

According to one exemplary embodiment, a clock phase shift detector circuit may include a phase detector that receives a first and a second clock signal, a current mirror, a first comparator, and a second comparator. The phase detector generates a phase signal based on a phase difference between the first and the second clock signal. The current mirror is coupled to the phase detector and includes a first integrator, a second integrator, and a third integrator, such that the first integrator integrates the first clock signal and generates a first voltage, the second integrator integrates the first clock signal and generates a second voltage, and the third integrator integrates the phase signal and generates a third voltage. The first comparator is coupled to the first and the third integrator, whereby the first comparator receives the first and the third voltage. The first comparator generates a first control signal based on an amplitude comparison between the first and the third voltage. The second comparator is coupled to the second and the third integrator, whereby the second comparator receives the second and the third voltage. The second comparator generates a second control signal based on an amplitude comparison between the second and the third voltage. The generated first and second control signal detect a change between the phase difference of the first and the second clock signal and an optimized phase difference.

According to another exemplary embodiment, a method of detecting a shift in phase relationship between a first and a second clock signal may include determining a phase difference between the first and the second clock signal, and integrating the first clock signal for generating a first voltage value. The first clock signal is also integrated for generating a second voltage value. The determined phase difference is integrated for generating a third voltage value. The first and the third voltage value are then compared for generating a first control signal. Also, the second and the third voltage value are compared for generating a second control signal, whereby the first and the second control signal detect the phase relationship between the first and the second clock signal. Based on the third voltage value being between the first and the second voltage value, the first and the second control signal detect no adjustment requirement for the determined phase difference between the first and the second clock signal.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following one or more exemplary embodiments describe a clock phase shift detector (PSD) unit that detects any phase deviation between two input clock signals based on a predetermined phase relationship. For example, in one implementation, a 90° or $\pi/2$ predetermined phase relationship may be required for two clock signals operating within a device or circuit. Accordingly, the following described PSD unit receives the two clock signals and detects any phase deviation or change in the 90° or $\pi/2$ phase relationship between the clocks. It may be appreciated, however, that the PSD unit may be utilized for detecting a phase deviation of an alternative predetermined value (e.g., 75°) between the two input clock signals.

Figure 1A:
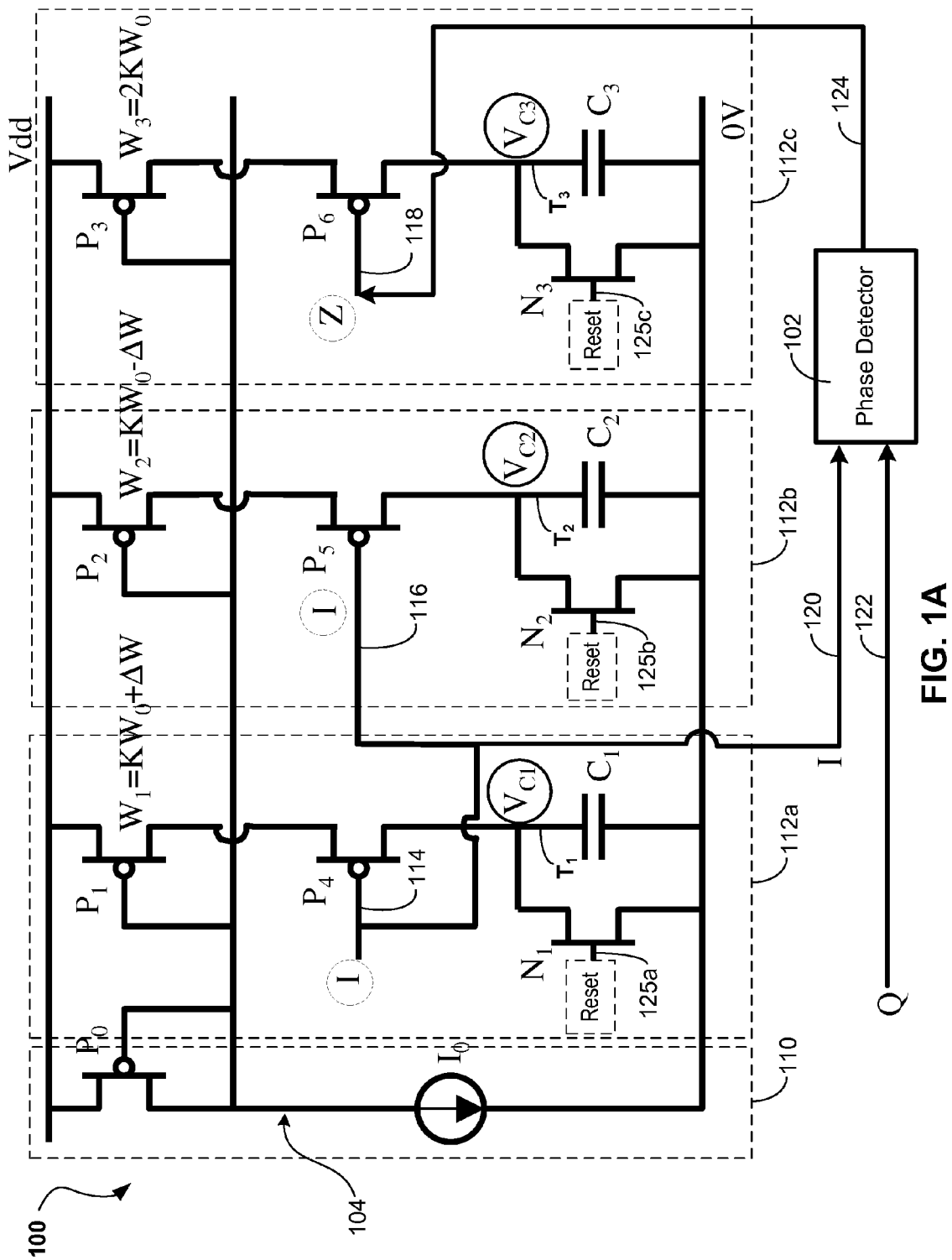
FIGS. 1A and 1B illustrate a clock phase shift detector (PSD) unit according to an exemplary embodiment.
Figure 1B:
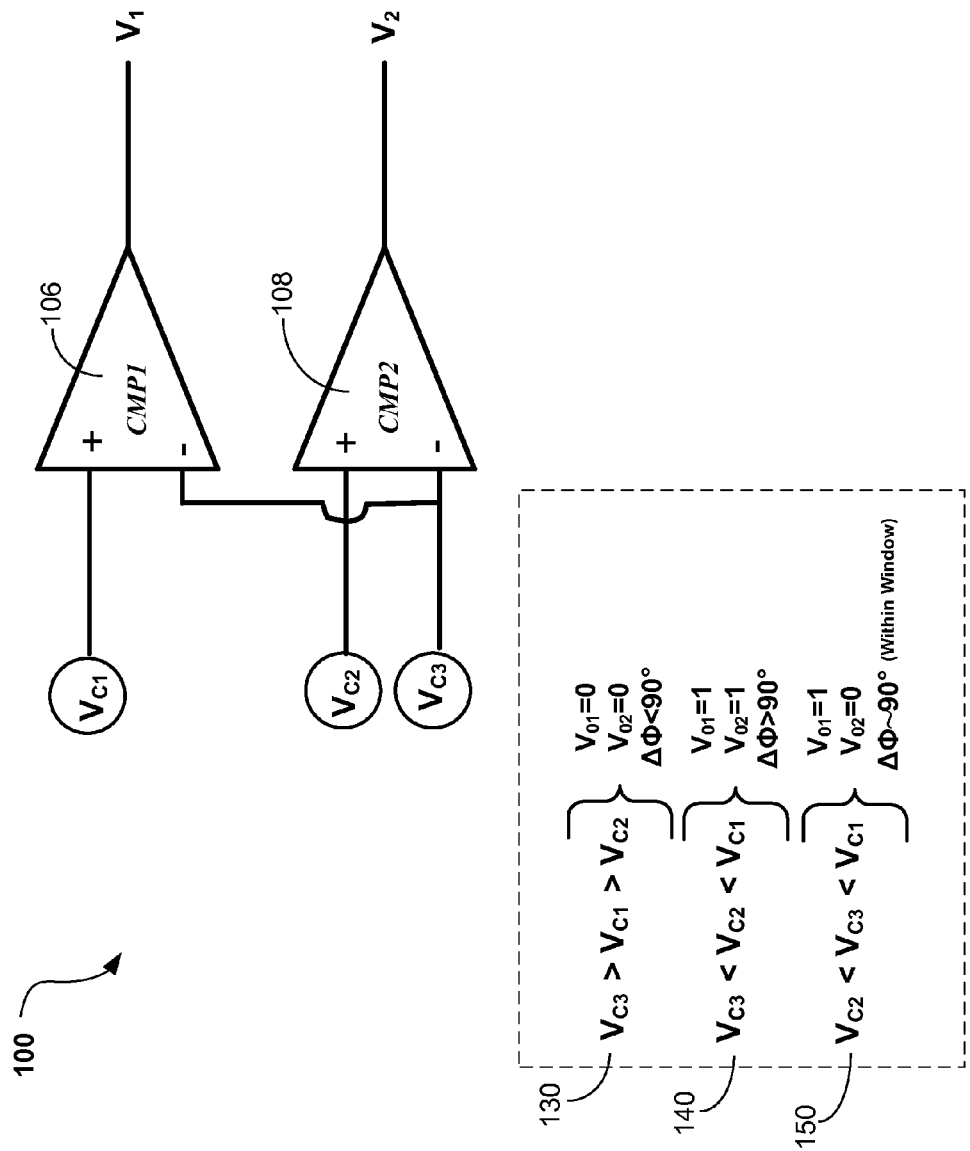

Referring to FIGS. 1A and 1B, a clock phase shift detector (PSD) unit 100 according to an exemplary embodiment is illustrated. The PSD unit 100 may include a phase detector 102 (FIG. 1A); a current mirror circuit 104 (FIG. 1A), and voltage comparator devices 106 (FIG. 1B) and 108 (FIG. 1B). Any known voltage comparator or phase detector device may be used for implementing the PSD unit 100. For example, as depicted, the phase detector 102 may be implemented by a NAND gate device. Alternative, the phase detector 102 may include an XOR or AND gate device (not shown). The clock phase shift detector (PSD) unit 100 receives a first clock signal I and a second clock signal Q, and generates an output V1, V2 that is indicative of, or detects, whether the phase difference between the I and Q clock signals has deviated from a predetermined desired value (i.e., an optimized phase difference of 90° or $\pi/2$).

Referring to FIG. 1A, current mirror 104 includes a primary current path 110. The current flowing in primary current path 110 is mirrored in secondary current paths 112a, 112b, and 112c. Current path 112a may include pFET transistor device $P_1$, pFET transistor device $P_4$, nFET reset control transistor $N_1$, and capacitor device $C_1$. The pFET transistor device $P_1$ sources the current that flows within current path 112a. The pFET transistor device $P_4$ receives the first clock signal I at its gate 114, whereby the pFET transistor device $P_4$ is switched ON and OFF as the voltage levels of first clock signal I switch between, for example, ground (e.g., 0 v) and the supply voltage (e.g., Vdd). In particular, pFET transistor device $P_4$ is switched OFF during the positive pulse period (i.e., Vdd) of clock I and switched ON during periods of the clock signal I that are at about 0 v or ground. When pFET transistor device $P_4$ is switched ON, the current sourced by pFET transistor device $P_1$ flows through pFET transistor device $P_4$ and charges capacitor $C_1$. Thus, the capacitor $C_1$ integrates this current flow to generate a voltage signal $V_{C1}$ at terminal $T_1$ of the capacitor $C_1$. In affect, since the clock signal I controls the current flow and subsequent integration process at capacitor $C_1$, the voltage signal $V_{C1}$ may correspond to an integrated version of clock signal I. Following each integration measurement, a positive reset pulse may be applied to the gate 125a of nFET reset control transistor $N_1$ in order to discharge capacitor $C_1$ prior to the next integration measurement. If the capacitor $C_1$ is not discharged, the capacitor $C_1$ will continue to ramp up and remain at the supply voltage value (e.g., Vdd).

Current path 112b may include pFET transistor device $P_2$, pFET transistor device $P_5$, nFET reset control transistor $N_2$, and capacitor device $C_2$. The pFET transistor device $P_2$ sources the current that flows within current path 112b. The pFET transistor device $P_5$ also receives clock signal I at its gate 116, whereby the pFET transistor device $P_5$ is switched ON and OFF as the voltage levels of first clock signal I switch between, for example, ground (e.g., 0 v) and the supply voltage (e.g., Vdd). In particular, pFET transistor device $P_5$ is switched OFF during the positive pulse period (i.e., Vdd) of clock I and switched ON during periods of the clock signal I that are at about 0 v or ground. When pFET transistor device $P_5$ is switched ON, the current sourced by pFET transistor device $P_2$ flows through pFET transistor device $P_5$ and charges capacitor $C_2$. Thus, the capacitor $C_2$ integrates the current flow to generate a voltage signal $V_{C2}$ at terminal $T_2$ of the capacitor $C_2$. In affect, since the clock signal I controls the current flow and subsequent integration process at capacitor $C_2$, the voltage signal $V_{C2}$ may correspond to an alternative integrated version of clock signal I. Following each integration measurement, a positive reset pulse may be applied to the gate 125b of nFET reset control transistor $N_2$ in order to discharge capacitor $C_2$ prior to the next integration measurement. If the capacitor $C_2$ is not discharged, the capacitor $C_2$ will continue to ramp up and remain at the supply voltage value (e.g., Vdd).

The phase detector 102 receives the first clock signal I and the second clock signal Q at inputs 120 and 122, respectively. The phase detector 102 then generates a phase signal at its output 124 (Z) based on the phase relationship between the first clock signal I and the second clock signal Q at it inputs 120, 122. Since the exemplary phase detector 102 may be implemented using a NAND gate circuit, only overlapping portions of the I and Q clocks both having a logic-high voltage level (e.g., Vdd) will generate a logic 0 (e.g., GND or 0 v) at output 124. All other combinations of voltage levels (i.e., different voltage levels or both at 0 v) corresponding to the clocks I, Q will cause a logic 1 (e.g., Vdd) at output 124. Thus, the generated phase signal's 0 v pulse periods may be used to indicate the measure of phase difference between the I and Q clocks. For example, when the phase relationship between the I and Q clocks is about 90° or π/2, the generated phase signal's 0 v pulse period may be a value that is about one quarter (¼) of the pulse period of either the I or the Q clock. As the phase relationship between the I and Q clocks exceeds 90° or π/2, the generated phase signal's 0 v pulse duration value becomes less one quarter (¼) of the pulse period of either the I or the Q clock. Alternatively, as the phase relationship between the I and Q clocks becomes less than 90° or π/2, the generated phase signal's 0 v pulse duration value becomes more than one quarter (¼) of the pulse period of either the I or the Q clock. As described in the following, these fluctuations in the phase signal may be used to detect any phase deviations from an optimized phase difference.

Current path 112c may include pFET transistor device $P_3$, pFET transistor device $P_6$, nFET reset control transistor $N_3$, and capacitor device $C_3$. The pFET transistor device $P_3$ sources the current that flows within current path 112c. The pFET transistor device $P_6$ receives the phase signal Z from output 124 of the phase detector at its gate 118, whereby the pFET transistor device $P_6$ is switched ON and OFF as the voltage levels of phase signal Z switch between, for example, ground (e.g., 0 v) and the supply voltage (e.g., Vdd). In particular, pFET transistor device $P_6$ is switched OFF during the positive pulse duration (i.e., Vdd) of phase signal Z and switched ON during durations of the phase signal Z that are at about 0 v or ground. When pFET transistor device $P_6$ is switched ON, the current sourced by pFET transistor device $P_3$ flows through pFET transistor device $P_6$ and charges capacitor $C_3$. Thus, the capacitor $C_3$ integrates the current flow to generate a voltage signal $V_{C3}$ at terminal $T_3$ of the capacitor $C_3$. In affect, since the phase signal Z controls the current flow and subsequent integration process at capacitor $C_3$, the voltage signal $V_{C3}$ may correspond to an integrated version of phase signal Z. Following each integration measurement, a positive reset pulse may be applied to the gate 125c of nFET reset control transistor $N_3$ in order to discharge capacitor $C_3$ prior to the next integration measurement. If the capacitor $C_3$ is not discharged, the capacitor $C_3$ will continue to ramp up and remain at the supply voltage value (e.g., Vdd).

In current path 112a, capacitor $C_1$ acts as a first integrator that integrates the I clock signal and generates reference voltage $V_{C1}$. In current path 112b, capacitor $C_2$ acts as a second integrator that also integrates the I clock signal and generates reference voltage $V_{C2}$. Reference voltage $V_{C1}$ is always greater than $V_{C2}$ based on the difference in channel width (i.e. $W_1$ vs. $W_2$) between pFET transistor devices $P_1$ and $P_2$, respectively. Thus, the reference voltages $V_{C1}$, $V_{C2}$ provide a voltage reference window having an upper limit determined by the value of $V_{C1}$ and a lower limit determined by the value of $V_{C2}$. If the integrated phase signal, which generates voltage $V_{C3}$, lies within the voltage reference window, it may be indicative that no phase adjustment is necessary.

In essence, the voltage reference window acts as a tolerance window or tolerance voltage range over which no corrective phase control may be necessary. By having such a tolerance window or tolerance voltage range, the output V1, V2 of the PSD unit 100 is not constantly detecting and signalling phase corrective measures. This in turn minimizes the jitter that may be observed in the phase relationship of the clock signals I, Q as a result of constant phase adjustments by the comparator about a single reference point. For example, with a single reference voltage (e.g., $V_1$), a PSD unit comparator output may constantly toggle between Vdd and 0 v (i.e., causing jitter) based on the phase signal being adjusted about the single reference voltage. In contrast, with the voltage reference window, the comparator outputs of PSD unit 100 may toggle between Vdd and 0 v based only on the phase signal falling outside the voltage range of the voltage reference window.

As explained above, reference voltage $V_{C1}$ is always greater than $V_{C2}$ based on the difference in channel width (i.e. $W_1$ vs. $W_2$) between pFET transistor devices $P_1$ and $P_2$, respectively. As depicted in FIG. 1A, the channel width of pFET transistor device $P_1$ is given by $W_1 = KW_0 + \Delta W$, where K is a constant and $+\Delta W$ is an added channel width. The channel width of pFET transistor device $P_2$ on the other hand is given by $W_2 = KW_0 - \Delta W$, where K is a constant and $-\Delta W$ is a reduced channel width. Thus, since $W_1$ is implemented to be larger than $W_2$, pFET transistor device $P_1$ sources more current than pFET transistor device $P_2$ and, therefore, voltage signal $V_{C1}$ is always greater than voltage signal $V_{C2}$. This voltage difference between $V_{C1}$ and $V_{C2}$ provides the reference voltage window. It may be appreciated that the currents sourced in current paths 112a and 112b depend mainly on the channel widths $W_1$, $W_2$ due to both pFET transistor devices $P_1$ and $P_2$ being driven by the same input signal (i.e., I clock) and pFET transistor devices $P_4$ and $P_5$ being identical.

The pFET transistor device $P_3$ has a channel width given by $W_3 = 2KW_0$, where K is a constant. The channel width of the pFET transistor device $P_3$ is designated to be approximately twice the size of the channel widths $W_1$, $W_2$ of pFET transistor devices $P_1$ and $P_2$. This increase in channel width ($W_3$) is due to the phase signal Z driving pFET transistor device $P_6$ having a narrower pulse duration compared to that of the I clock signals driving pFET transistor devices $P_4$ and $P_5$. When the phase relationship between the I and Q clock signals is approximately optimized at 90° or $\pi/2$, the width of the phase signal Z pulse period may be approximate half that of the I clock signal. Thus, in order to compensate for the narrower pulse duration (signal Z) received at pFET transistor device $P_6$, the width $W_3$ of pFET transistor device $P_3$ is approximately doubled in order to source more current during the smaller pulse duration. This in turn causes enough current to flow along path 112c so that the generated voltage signal $V_{C3}$ (i.e., integrated phase signal Z) falls within the voltage range of the voltage reference window set by $V_{C1}$ and $V_{C2}$. In the depicted embodiment of current mirror 104, pFET transistor devices $P_4$-$P_6$ are identical. Also, capacitor devices $C_1$-$C_3$ are identical.

Referring to FIG. 1B, the voltage comparators 106, 108 receive the integrated first clock signal defined by voltage signal $V_{C1}$, the integrated first clock signal defined by voltage signal $V_{C2}$, and the integrated phase signal defined by voltage signal $V_{C3}$. Specifically, voltage comparator 106 receives the integrated first clock signal defined by voltage signal $V_{C1}$ and the integrated phase signal defined by voltage signal $V_{C3}$. Voltage comparator 108 receives the other integrated first clock signal defined by voltage signal $V_{C2}$ and the integrated phase signal defined by voltage signal $V_{C3}$. The voltage levels of the integrated first clock signals and the integrated phase signal are then compared by voltage comparators 106 and 108. Depending on which voltage is greater, the comparator outputs $V_1$, $V_2$ swing to either their supply voltage (Vdd or logic 1) or ground (GND or logic 0). It may be appreciated that the generated phase signal described in the following may be based on NAND gate phase detector. As previously indicated, AND, XOR, or any other phase detector circuit may be used in association with voltage comparators 106 and 108. However, different phase detector circuits may contribute to generating different comparator output $V_1$, $V_2$ signals and, therefore, a phase control circuit (e.g., FIG. 3: phase delay stage 302) may provide phase control in accordance with the particular comparator output $V_1$, $V_2$ signals received.

As indicated by scenario 130, for example, the integrated phase signal defined by voltage signal $V_{C3}$ may be larger than both the integrated first clock signal defined by voltage signal $V_{C1}$ and the integrated first clock signal defined by voltage signal $V_{C2}$. When the phase difference between the clock signals I, Q are less than the optimized 90° or $\pi/2$ value, the generated pulse (logic 1→logic 0 transition) at the output 124 (FIG. 1A) of the phase detector 102 (FIG. 1A) may have an increased pulse width. This increased pulse width switches pFET transistor device $P_6$ ON for a longer duration, which raises voltage signal $V_{C3}$ above $V_{C1}$ and $V_{C2}$. Thus, at comparator 106, since $V_{C3}$ is greater than $V_{C1}$, the output $V_1$ of comparator 106 is at 0 v or logic 0. At comparator 108, since $V_{C3}$ is also greater than $V_{C2}$, the output $V_2$ of comparator 108 is also at 0 v or logic 0. Accordingly, the 0 v or logic 0 values of $V_1$ and $V_2$ may be used as a control signal to adjust the phase of one of the clocks towards achieving the optimized phase difference of about 90° or $\pi/2$. This may be accomplished by, for example, delaying one of the clocks (I) in order to increase the phase difference between the clocks I, Q.

As indicated by scenario 140, for example, the integrated phase signal defined by voltage signal $V_{C3}$ may be less than both the integrated first clock signal defined by voltage signal $V_{C1}$ and the integrated first clock signal defined by voltage signal $V_{C2}$. When the phase difference between the clock signals I, Q is greater than the optimized 90° or $\pi/2$ value, the generated pulse (logic 1→logic 0 transition) at the output 124 (FIG. 1A) of the phase detector 102 (FIG. 1A) may have a reduced pulse width. This reduced pulse width switches pFET transistor device $P_6$ ON for a shorter duration, which reduces voltage signal $V_{C3}$ below both $V_{C1}$ and $V_{C2}$. Thus, at comparator 106, since $V_{C3}$ is less than $V_{C1}$, the output $V_1$ of comparator 106 is at Vdd (i.e., supply voltage) or logic 1. At comparator 108, since $V_{C3}$ is also less than $V_{C2}$, the output $V_2$ of comparator 108 is also at Vdd (i.e., supply voltage) or logic 1. Accordingly, the Vdd values of $V_1$ and $V_2$ may be used as a control signal to adjust the phase of one of the clocks towards achieving the optimized phase difference of about 90° or $\pi/2$. This may be accomplished by, for example, delaying one of the other clocks (I) in order to reduce the phase difference between the clocks I, Q.

As indicated by scenario 150, for example, the integrated phase signal defined by voltage signal $V_{C3}$ may be between the integrated first clock signal defined by voltage signal $V_{C1}$ and the integrated first clock signal defined by voltage signal $V_{C2}$. Under these conditions, the integrated phase signal defined by voltage signal $V_{C3}$ lies within the voltage reference window determined by the $V_{C1}$ and $V_{C2}$ values. When the phase difference between the clock signals I, Q are approximately optimized at 90° or $\pi/2$, the generated pulse (logic 1→logic 0 transition) at the output 124 (FIG. 1A) of the phase detector 102 (FIG. 1A) may have a pulse width that switches the pFET transistor device $P_6$ ON for a duration that raises voltage signal $V_{C3}$ to be within $V_{C1}$ and $V_{C2}$. Thus, at comparator 106, since $V_{C3}$ is less than $V_{C1}$, the output $V_1$ of comparator 106 is at Vdd (i.e., supply voltage) or logic 1. At comparator 108, since $V_{C3}$ is greater than $V_{C2}$, the output $V_2$ of comparator 108 is at 0 v or logic 0. Accordingly, the $V_1$ and $V_2$ values of Vdd (logic 1) and 0 v (logic 0), respectively, may be used as a control signal that is indicative that no phase adjustment of the clocks I, Q towards achieving the optimized phase difference of about 90° or $\pi/2$ is necessary.

An optimized phase difference between the clock signals may include any predetermined or selected target phase difference. For example, if a system or device requirement is a clock pair having a 90° or $\pi/2$ phase difference, then this phase difference (90° or $\pi/2$) value becomes the optimized phase difference, which is to be maintained. Alternatively, for example, in other implementations a system or device requirement may include a clock pair having a 45° or $\pi/4$ phase difference. In such an example, the optimized phase difference becomes the target 45° or $\pi/4$ phase difference.

Figure 2:
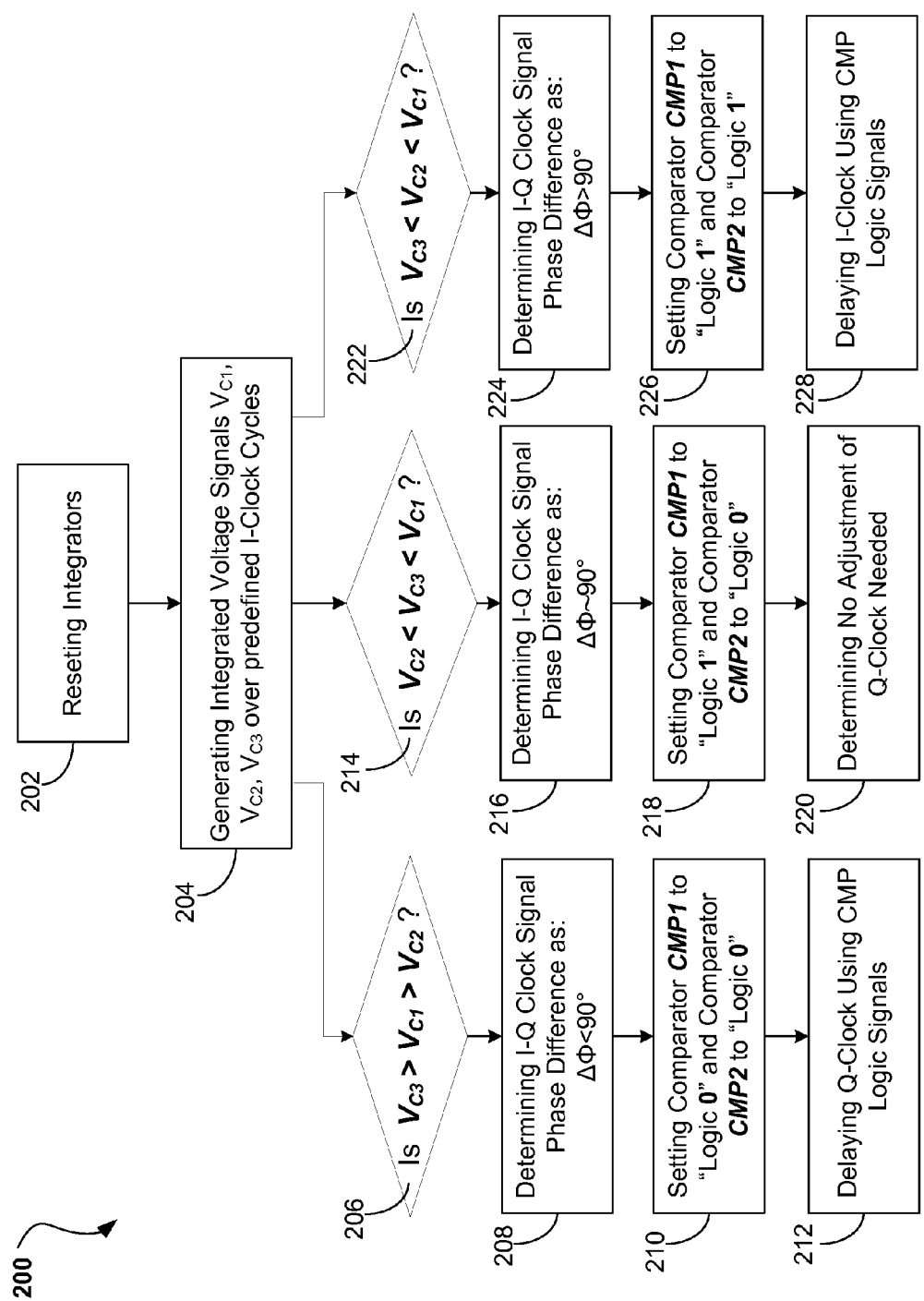
FIG. 2 is an operational flow chart corresponding to the exemplary embodiment of the PSD unit shown in FIGS. 1A and 1B.

FIG. 2 is an operational flow chart 200 corresponding to the exemplary embodiment of the PSD unit shown in FIGS. 1A and 1B. The flow chart will be described with the aid of the PSU unit 100 depicted in FIGS. 1A and 1B. At 202, the integrators, which include capacitors $C_1$-$C_3$, are reset by applying a positive pulse to the nFET reset control transistor $N_1$-$N_3$. This may cause the stored voltage across the capacitors to be discharged as the nFET reset control transistors $N_1$-$N_3$ electrically couple or short the terminals of each of the respective capacitors $C_1$-$C_3$.

At 204, the integrated voltage signals $V_{C1}, V_{C2}, V_{C3}$ at each current path 112a-112c are generated over pre-defined I clock cycles. For example, at path 112a, current flowing through pFET devices $P_1$ and $P_4$ under the control the I clock signal (i.e., negative pulse period) is integrated to generate voltage $V_{C1}$. Also, at path 112b, current flowing through pFET devices $P_2$ and $P_5$ under the control the I clock signal (i.e., negative pulse period) is integrated to generate voltage $V_{C2}$. Further, at path 112c, current flowing through pFET devices $P_3$ and $P_6$ under the control the phase signal Z (i.e., negative pulse period) generated at the output 124 of the phase detector 102 is integrated to generate voltage $V_{C3}$.

At 206, it may be determined whether generated voltage $V_{C3}$ is greater than generated voltages $V_{C1}$ and $V_{C2}$. If not, the process moves to 214. If so, at 208 it may be detected that the I and Q clock signals have a phase difference that is less than the optimized phase difference of, for example, 90° or π/2. Accordingly, at 210 both comparator 106 (CMP1) and comparator 108 (CMP2) generate a logic 0. At 212, the comparator outputs (i.e., $V_1$=0, $V_2$=0) may be used as control signals to delay, for example, the Q clock signal in order to increase the relative phase difference between the clock signals I, Q. By increasing the Q clock delay, the phase difference between the clock signals I, Q may approach the desired optimized phase difference value (e.g., 90° or π/2).

At 214, it may be determined whether generated voltage $V_{C3}$ is between generated voltages $V_{C1}$ and $V_{C2}$. If not, the process moves to 222. If so, at 216 it may be detected that the I and Q clock signals have a phase difference that is approximately the same as the optimized phase difference of, for example, 90° or π/2. Accordingly, at 218 comparator 106 (CMP1) generates a logic 1 (i.e., $V_1$=1) and comparator 108 (CMP2) generate a logic 0 (i.e., $V_2$=0). At 220, the comparator outputs (i.e., $V_1$=1, $V_2$=0) may be used as control signals that are indicative that any phase difference adjustment between the clock signals I, Q is not necessary. Thus, when the value of generated voltage $V_{C3}$ is between the voltage tolerance window produced by voltages $V_{C1}$ and $V_{C2}$, no phase difference adjustment between the clock signals I, Q may be needed.

At 222, it may be determined whether generated voltage $V_{C3}$ is less than generated voltages $V_{C1}$ and $V_{C2}$. If so, at 224 it may be detected that the I and Q clock signals have a phase difference that is greater than the optimized phase difference of, for example, 90° or π/2. Accordingly, at 226 both comparator 106 (CMP1) and comparator 108 (CMP2) generate a logic 1 (i.e., $V_1$=1, $V_2$=1). At 212, the comparator outputs (i.e., $V_1$=0, $V_2$=0) may be used as control signals to delay, for example, the I clock signal in order to decrease the relative phase difference between the clock signals I, Q. By increasing the I clock delay, the phase difference between the clock signals I, Q may approach the desired optimized phase difference value (e.g., 90° or π/2).

Figure 3:
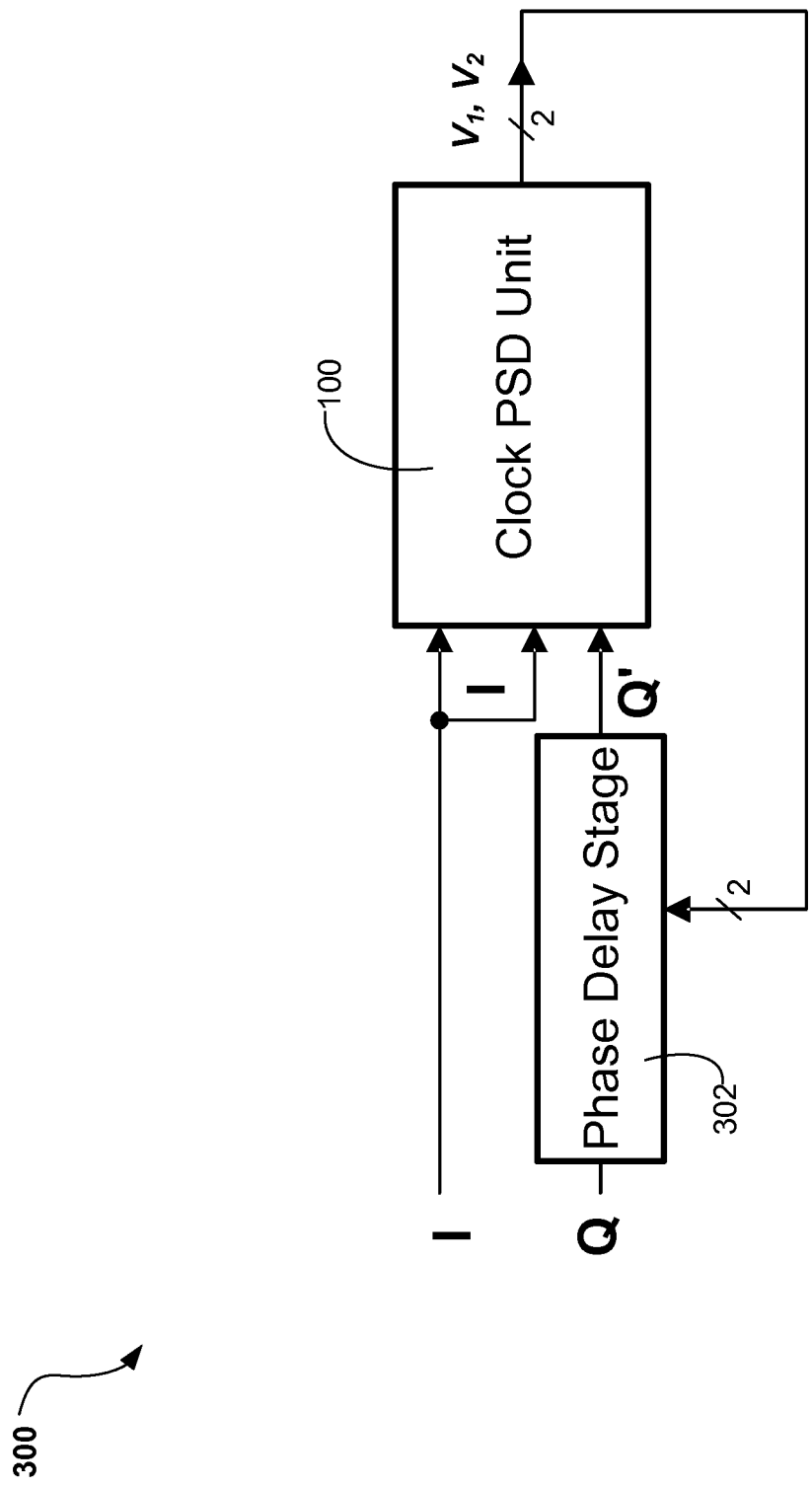
FIG. 3 is a clock phase control circuit that utilizes the exemplary PSD embodiment depicted in FIGS. 1A-1B.

FIG. 3 is a clock phase control circuit 300 that may utilize the exemplary PSD embodiment 100 depicted in FIGS. 1A and 1B. As depicted, at the PSU 100, the outputs $V_1$, $V_2$ of the comparators 106, 108 (FIG. 1) may generate control signals that are fed to a phase delay stage 302 in order to control the phase relationship between input clock signals I and Q. Based on the control signal voltages at outputs $V_1$ and $V_2$, the phase delay stage 302 may apply a phase correction to one of the clock signals (e.g., clock Q) until the desired phase relationship between the clock signals I, Q is established.

As described in the above paragraphs, the clock inputs I, Q' to the PSU 100 are processed in order to detect their phase relationship. For example, based on the phase relationship between the clock inputs I, Q' being less than 90° or π/2, the control signals generated at the outputs $V_1$, $V_2$ of the comparators 106, 108 may both be at logic 0. Applying these logic 0 control values to the phase delay stage 302 may signal the phase delay stage 302 to increase the delay of the input Q clock relative to the I clock and generate increased delay clock Q'. As the clock Q' is delayed and the I and Q' clocks approach the 90° or π/2 target phase difference, the voltage difference between the comparator inputs (FIG. 2: $V_{C3}$, $V_{C2}$, $V_{C1}$) start to decrease until $V_{C3}$ lies within $V_{C2}$ and $V_{C1}$, and, therefore, no more phase adjustment via delay stage 302 is necessary.

Alternatively, based on the phase relationship between the clock inputs I, Q' being more than 90° or π/2, the control signals generated at the outputs $V_1$, $V_2$ of the comparators 106, 108 may both be at logic 1. Applying these logic 1 control values to the phase delay stage 302 may signal the phase delay stage 302 to decrease the delay of the input Q clock relative to the I clock and generate decreased delay clock Q'. As the clock Q' is delayed less and the I and Q' clocks approach the 90° or π/2 target phase difference, the voltage difference between the comparator inputs (FIG. 2: $V_{C3}$, $V_{C2}$, $V_{C1}$) start to decrease until $V_{C3}$ once again lies within $V_{C2}$ and $V_{C1}$, and, therefore, no more phase adjustment via delay stage 302 is necessary.

Further, based on the phase relationship between the clock inputs I, Q' being approximately 90° or π/2, the control signal generated at the output $V_1$ of comparator 106 may be at logic 1, while the control signal generated at the output $V_2$ of comparator 108 may be at logic 0. Applying these logic 1 and logic 0 control values to the phase delay stage 302 may signal the phase delay stage 302 that no clock phase adjustment is necessary. As previously described, the generated $V_{C3}$ value may be between the generated $V_{C2}$ and $V_{C1}$ values without triggering any phase adjustment via the comparator outputs. Therefore, even though the phase difference between the clock signal may deviate slightly from the optimized value of 90° or π/2, the reference voltage window produced by the $V_{C2}$ and $V_{C1}$ values provide a phase difference tolerance range over which no adjustment between the I and Q' clocks is necessary. Consequently, jitter associated with the comparator output and, therefore, jitter associated with phase difference between the clocks I, Q' clocks is mitigated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A clock phase shift detector circuit, comprising
a phase detector that receives a first and a second clock signal, the phase detector generating a phase signal based on a phase difference between the first and the second clock signal;
a current mirror coupled to the phase detector, the current mirror having a first integrator, a second integrator, and a third integrator, wherein the first integrator integrates the first clock signal and generates a first voltage, the second integrator integrates the first clock signal and generates a second voltage, and the third integrator integrates the phase signal and generates a third voltage;
a first comparator coupled to the first and the third integrator, the first comparator receiving the first and the third voltage, wherein the first comparator generates a first control signal based on an amplitude comparison between the first and the third voltage; and
a second comparator coupled to the second and the third integrator, the second comparator receiving the second and the third voltage, wherein the second comparator generates a second control signal based on an amplitude comparison between the second and the third voltage,
wherein the generated first and second control signal detect a change between the phase difference of the first and the second clock signal and an optimized phase difference.

2. The circuit of claim 1, wherein:
the first integrator comprises a first capacitor and a first reset transistor coupled across the first capacitor for discharging the first capacitor;
the second integrator comprises a second capacitor and a second reset transistor coupled across the second capacitor for discharging the second capacitor; and
the third integrator comprises a third capacitor and a third reset transistor coupled across the third capacitor for discharging the third capacitor.

3. The circuit of claim 1, wherein the current mirror comprises:
a first current path including the first integrator and a first transistor, the first transistor sourcing a first current value through the first integrator and generating the first voltage;
a second current path including the second integrator and a second transistor, the second transistor sourcing a second current value through the second integrator and generating the second voltage; and
a third current path including the third integrator and a third transistor, the third transistor sourcing a third current value through the third integrator and generating the third voltage.

4. The circuit of claim 3, wherein the first and the second current path comprise a voltage reference window having an upper voltage limit corresponding to the first voltage and a lower voltage limit corresponding to the second voltage, such that when the third voltage has a value that is between the lower and the upper voltage limit, no change between the phase difference of the first and the second clock signal is detected.

5. The circuit of claim 1, wherein the first control signal and the second control signal both comprise logic-low values based on the third voltage associated with the phase signal being greater than the first and the second voltage, the logic-low values detecting the phase difference between the first and the second clock signal as being less than 90°.

6. The circuit of claim 1, wherein the first control signal and the second control signal both comprise logic-high values based on the third voltage associated with the phase signal being less than the first and the second voltage, the logic-high values detecting the phase difference between the first and the second clock signal as exceeding 90°.

7. The circuit of claim 1, wherein the first control signal comprises a logic-high value and the second control signal comprises a logic-low value based on the third voltage associated with the phase signal being between the first and the second voltage, the logic-high value and the logic-low value detecting no required phase adjustment between the first and the second clock signal.

8. The circuit of claim 1, wherein the phase signal comprises a pulse signal based on the phase difference between the first and the second clock signal being greater than 0° and less than 180°.

9. The circuit of claim 1, wherein the phase detector comprises a NAND gate having a first input, a second input, and an output, such that the first input is coupled to the first clock signal, the second input is coupled to the second clock signal, and the output is coupled to an input of the third integrator.

10. The circuit of claim 1, wherein the optimized phase difference is about 90°.

11. A method of detecting a shift in phase relationship between a first and a second clock signal, comprising:
determining a phase difference between the first and the second clock signal;
integrating the first clock signal for generating a first voltage value;
integrating the first clock signal for generating a second voltage value;
integrating the determined phase difference for generating a third voltage value;
comparing the first and the third voltage value for generating a first control signal; and
comparing the second and the third voltage value for generating a second control signal, the first and the second control signal detecting the phase relationship between the first and the second clock signal,
wherein based on the third voltage value being between the first and the second voltage value, the first and the second control signal detect no adjustment requirement for the determined phase difference between the first and the second clock signal.

12. The method of claim 11, wherein based on the third voltage value exceeding both the first and the second voltage value, the first and the second control signal detects a decrease in the determined phase difference between the first and the second clock signal compared to an optimized phase difference.

13. The method of claim 12, wherein based on both the first and the second voltage value exceeding the third voltage value, the first and the second control signal detects an increase in the determined phase difference between the first and the second clock signal compared to an optimized phase difference.

14. The method of claim 13, wherein the optimized phase difference is about 90°.

15. The method of claim 11, wherein determining the phase difference comprises applying NAND gate logic to the first and the second clock signal.

16. The method of claim 11, wherein the first and the second voltage value generate a voltage reference window, such that when the third voltage has a value that is within the voltage reference window, no change between the phase difference of the first and the second clock signal is detected.

17. The method of claim 11, wherein generating the first voltage value comprises charging a first capacitor device using the first clock signal.

18. The method of claim 17, wherein generating the second voltage value comprises charging a second capacitor device using the second clock signal.

19. The method of claim 18, wherein generating the third voltage value comprises charging a third capacitor device using the determined phase difference.

20. The method of claim 19, further comprising discharging the first, the second, and the third capacitor device following each detecting of the phase relationship between the first and the second clock signal.

* * * * *